United States Patent
Jacob et al.

(10) Patent No.: US 11,309,447 B2
(45) Date of Patent: Apr. 19, 2022

(54) SEPARATE ABSORPTION CHARGE AND MULTIPLICATION AVALANCHE PHOTODIODE STRUCTURE AND METHOD OF MAKING SUCH A STRUCTURE

(71) Applicant: GLOBALFOUNDRIES U.S. Inc., Santa Clara, CA (US)

(72) Inventors: Ajey Poovannummoottil Jacob, Watervliet, NY (US); Yusheng Bian, Ballston, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 195 days.

(21) Appl. No.: 16/727,321

(22) Filed: Dec. 26, 2019

(65) Prior Publication Data

US 2021/0202778 A1 Jul. 1, 2021

(51) Int. Cl.
H01L 31/107 (2006.01)
H01L 31/18 (2006.01)
H01L 31/028 (2006.01)
H01L 31/0352 (2006.01)

(52) U.S. Cl.
CPC ........ H01L 31/1075 (2013.01); H01L 31/028 (2013.01); H01L 31/035218 (2013.01); H01L 31/1812 (2013.01)

(58) Field of Classification Search
CPC ............... H01L 31/1075; H01L 31/028; H01L 31/035218; H01L 31/1812; H01L 31/03845; H01L 31/1804; H01L 31/107
See application file for complete search history.

(56) References Cited

U.S. PATENT DOCUMENTS

| 6,072,201 | A | 6/2000 | Fang et al. |
| 6,515,315 | B1 | 2/2003 | Itzler et al. |
| 8,338,857 | B2 | 12/2012 | Morse et al. |
| 8,829,566 | B2 | 9/2014 | Morse et al. |
| 2009/0095349 | A1* | 4/2009 | Forrest .................. B82Y 30/00 136/262 |
| 2012/0111398 | A1* | 5/2012 | Suto ................ H01L 31/035218 136/255 |
| 2018/0006174 | A1* | 1/2018 | Yoshikawa ..... H01L 31/022466 |

FOREIGN PATENT DOCUMENTS

| CN | 106299015 A | * | 1/2017 | |
| WO | WO-2017023301 A1 | * | 2/2017 | ......... H01L 31/0352 |

OTHER PUBLICATIONS

Bowers, J.E. et al.; "High-Speed Photodetectors"; Optical Detectors; Chapter 17; pp. 29.

(Continued)

*Primary Examiner* — Hoang-Quan Ho
(74) *Attorney, Agent, or Firm* — Hoffman Warnick LLC

(57) ABSTRACT

One illustrative photodiode disclosed herein includes an N-doped anode region, a P-doped cathode region and at least one P-doped charge region positioned laterally between the N-doped anode region and the P-doped cathode region. In this example, the photodiode also includes a plurality of quantum dots embedded within the at least one P-doped charge region and an N-doped impact ionization region positioned laterally between the N-doped anode region and the at least one P-doped charge region.

20 Claims, 16 Drawing Sheets

(56) References Cited

OTHER PUBLICATIONS

Braley, Joseph S.; "Photo Detectors"; pp. 5.
Anselm et al., "Performance of Thin Separate Absorption, Charge, and Multiplication Avalanche Photodiodes," IEEE Journal of Quantum Electronics, 34:482-90, Mar. 1998.
Bowers and Wey, Optical Detectors, Chapter 17, High-Speed Photodetectors.
Dai et al., "Monolithic Germanium/Silicon Photodetectors With Decoupled Structures: Resonant APDs and UTC Photodiodes," IEEE Journal of Selected Topics in Quantum Electronics, 20:3802214, Nov./Dec. 2014.
Kim et al., "Improved Spectral Response of an InAs QD RC-SACM-APD with Ta2O5/SiO2 DBRs," Proceedings of the 7th IEEE International Conference on Nanotechnology, pp. 681-685, Aug. 2-5, 2007.
Martinez et al.,"High performance waveguide-coupled Ge-on-Si linear mode avalanche photodiodes," Optics Express, 24:19072-81, Aug. 22, 2016.
Song et al., "Characteristics of InAs QDs/GaAs RC-SACM APD on the Etching Process of the Active-Mesa," IEEE Sensors 2006, pp. 197-200, Oct. 22-25, 2006.
Yuan et al., "High-Speed Quantum-Dot Resonant-Cavity SACM Avalanche Photodiodes Operating at 1.06 um," 0.7803-5633-1/99, 1999 IEEE, pp. 13-14.

\* cited by examiner

SEPARATE ABSORPTION CHARGE AND MULTIPLICATION AVALANCHE PHOTODIODE STRUCTURE AND METHOD OF MAKING SUCH A STRUCTURE

BACKGROUND

Field of the Invention

The present disclosure generally relates to various novel embodiments of a separate absorption charge and multiplication (SACM) avalanche photodiode (APD) structure and various methods of making such a structure.

Description of the Related Art

A need for greater bandwidth in fiber optic network links is widely recognized. The volume of data transmissions has seen a dramatic increase in the last decade. This trend is expected to grow exponentially in the near future. As a result, there exists a need for deploying an infrastructure capable of handling this increased volume and for improvements in system performance. Fiber optics communications have gained prominence in telecommunications, instrumentation, cable TV, network, and data transmission and distribution. A fiber optics communication system or link includes a photo detector element. The function of the photo detector element in a fiber optic communication system is to convert optical power into electrical voltage or current. The most common photo detector used in fiber applications is the photodiode.

There are two options for the photodiode element: a standard P-I-N diode structure (positive/intrinsic/negative type conductivity) and the avalanche photodiode (APD). The type of semiconductor photodiode commonly used for fiber optics applications has a reverse bias p-n junction. Both types of photodiodes are instantaneous photon-to-electron converters where absorbed photons generate hole-electron pairs to produce an electric current. The P-I-N photodiode and the avalanche photodiode are actually modified p-n junction devices with additional layers at differing doping levels that produce either more efficient quantum conversion or avalanche gain through ionization. A photon is absorbed in a relatively high E (electric) field region, where an electron-hole pair is created. This will produce current in the detector circuit. Although an avalanche photodiode requires higher operating voltages, which must be compensated for with respect to temperature shifts, the internal gain of the avalanche photodiode provides a significant enhancement in receiver sensitivity and can be a key enabler in the manufacturing of high sensitivity optical receivers for high speed applications. Avalanche photodiodes exhibit internal gain through avalanche multiplication. In the presence of sufficiently high electric field intensity, an initial photon-induced carrier can seed an avalanche process in which carriers obtain enough energy from the electric field to generate additional carrier pairs through impact ionization. By such an effect, a single photon can give rise to tens or even hundreds of carriers which contribute to the resulting photo current. Moreover, an avalanche photodiode typically provides a significant increase in the receiver signal-to-noise ratio (SNR). The increased SNR is particularly attractive at higher frequencies where increased amplifier noise is unavoidable.

There is a need to produce a novel avalanche photodiode that is efficient to manufacture and may produce benefits with respect to the optical system or link in which such avalanche photodiodes are employed. The present disclosure is generally directed to a separate absorption charge and multiplication (SACM) avalanche photodiode (APD) structure and various methods of making such a structure.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a separate absorption charge and multiplication (SACM) avalanche photodiode (APD) structure and various methods of making such a structure. One illustrative photodiode disclosed herein includes an N-doped anode region, a P-doped cathode region and at least one P-doped charge region positioned laterally between the N-doped anode region and the P-doped cathode region. In this example, the photodiode also includes a plurality of quantum dots embedded within the at least one P-doped charge region and an N-doped impact ionization region positioned laterally between the N-doped anode region and the at least one P-doped charge region.

BRIEF DESCRIPTION OF THE DRAWINGS

The disclosure may be understood by reference to the following description taken in conjunction with the accompanying drawings, in which like reference numerals identify like elements, and in which.

Figure 1:
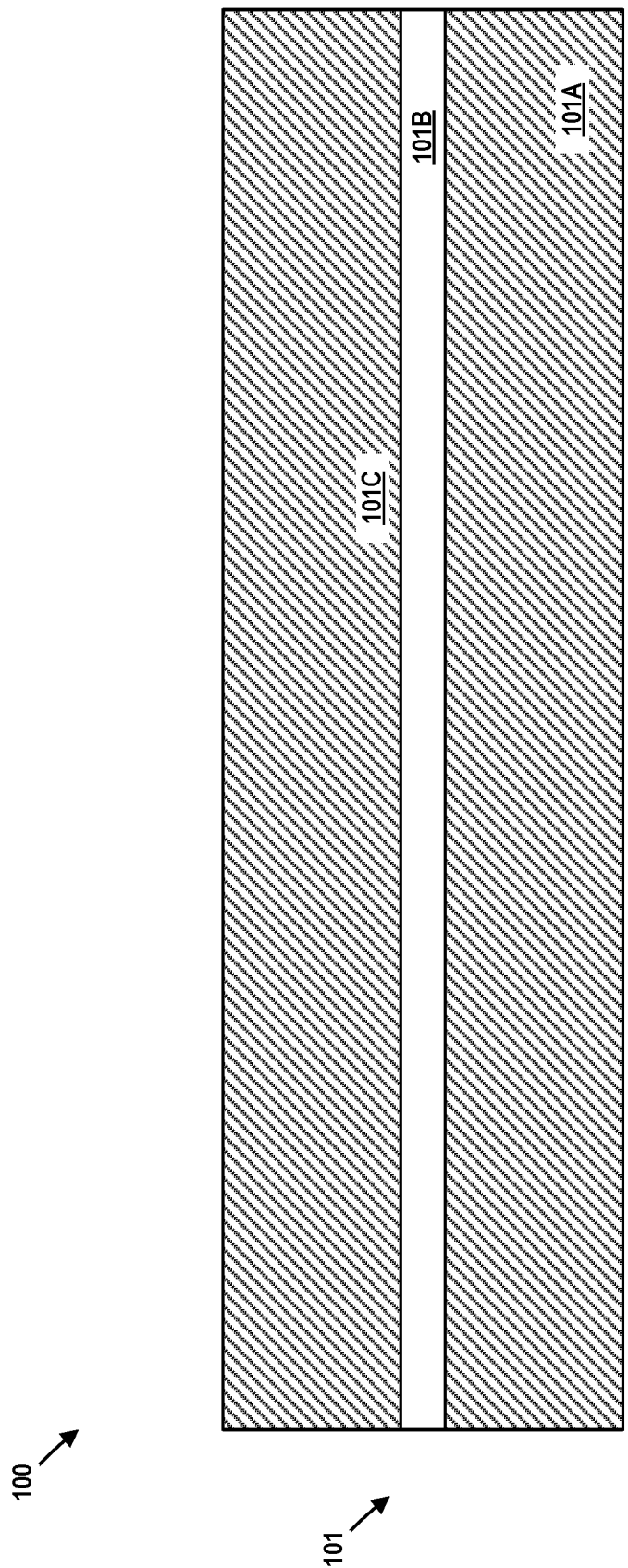
FIGS. 1-16 depict various novel embodiments of a separate absorption charge and multiplication (SACM) avalanche photodiode (APD) structure and various methods of making such a structure. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-16 depict various novel embodiments of a separate absorption charge and multiplication (SACM) avalanche photodiode (APD) structure 100 and various methods of making such a structure. In the examples depicted herein, the photodiode structure 100 will be formed above a semiconductor substrate 101. The substrate 101 may have a variety of configurations, such as a semiconductor-on-insulator (SOI) shown in FIG. 1. Such an SOI substrate 101 includes a base semiconductor layer 101A, a buried insulation layer 101B positioned on the base semiconductor layer 101A and an active semiconductor layer 101C positioned above the buried insulation layer 101, wherein the photodiode structure 100 will be formed in and above the active semiconductor layer 101C. In one illustrative embodiment, the active semiconductor layer 101C may be a substantially un-doped semiconductor material, a portion of which, in one illustrative embodiment, may function as an intrinsic semiconductor material layer in the final photodiode structure 100. The active semiconductor layer 101C may be of any desired thickness, e.g., 150-220 nm. Alternatively, the substrate 101 may have a simple bulk configuration. The substrate 101 may be made of silicon or it may be made of semiconductor materials other than silicon. Thus, the terms "substrate" or "semiconductor substrate" should be understood to cover all semiconductor materials and all forms of such materials.

Figure 2:
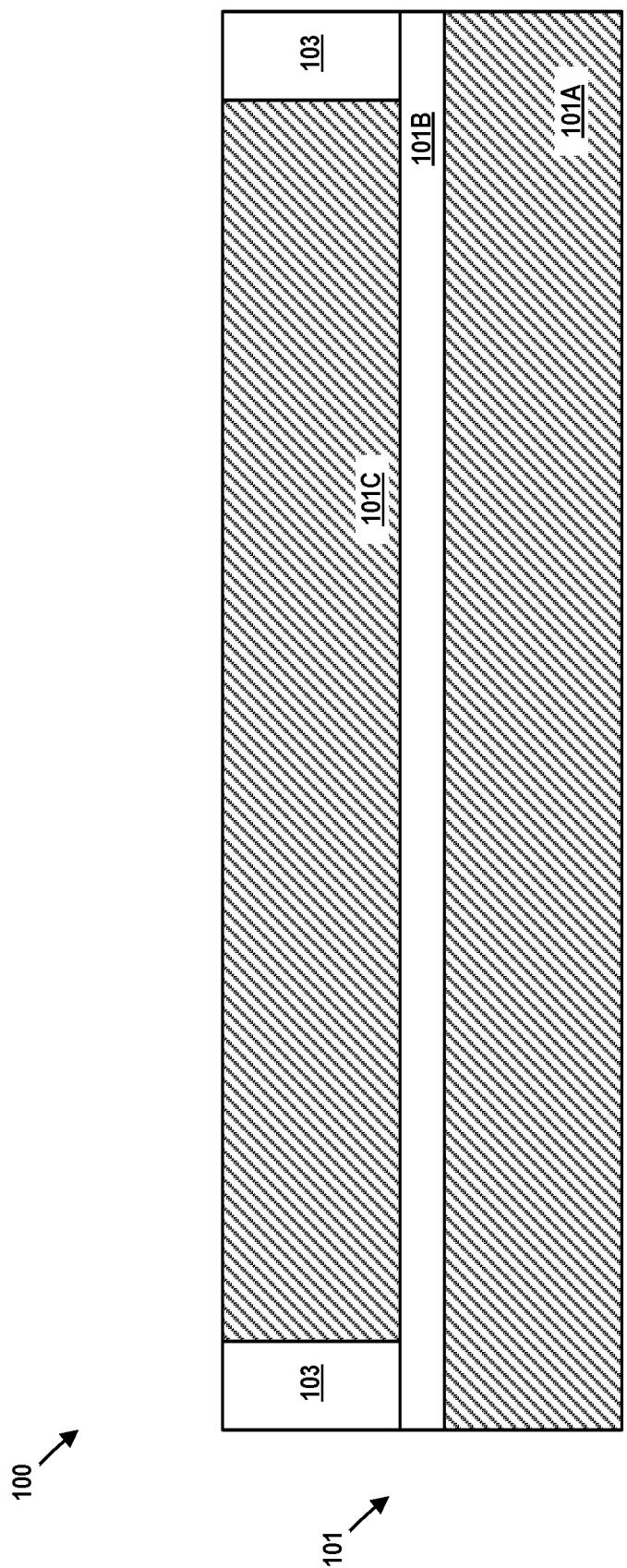

FIG. 2 is a cross-sectional view of one illustrative embodiment of a photodiode structure 100 disclosed herein at an early stage of fabrication. More specifically, FIG. 2 depicts the photodiode structure 100 after an isolation structure 103 (e.g., a shallow trench isolation structure) has been formed in the active semiconductor layer 101C. The isolation structure 103 may be comprised of a variety of different materials, e.g., silicon dioxide, and it may be formed using techniques that are well known to those skilled in the art.

Figure 3:
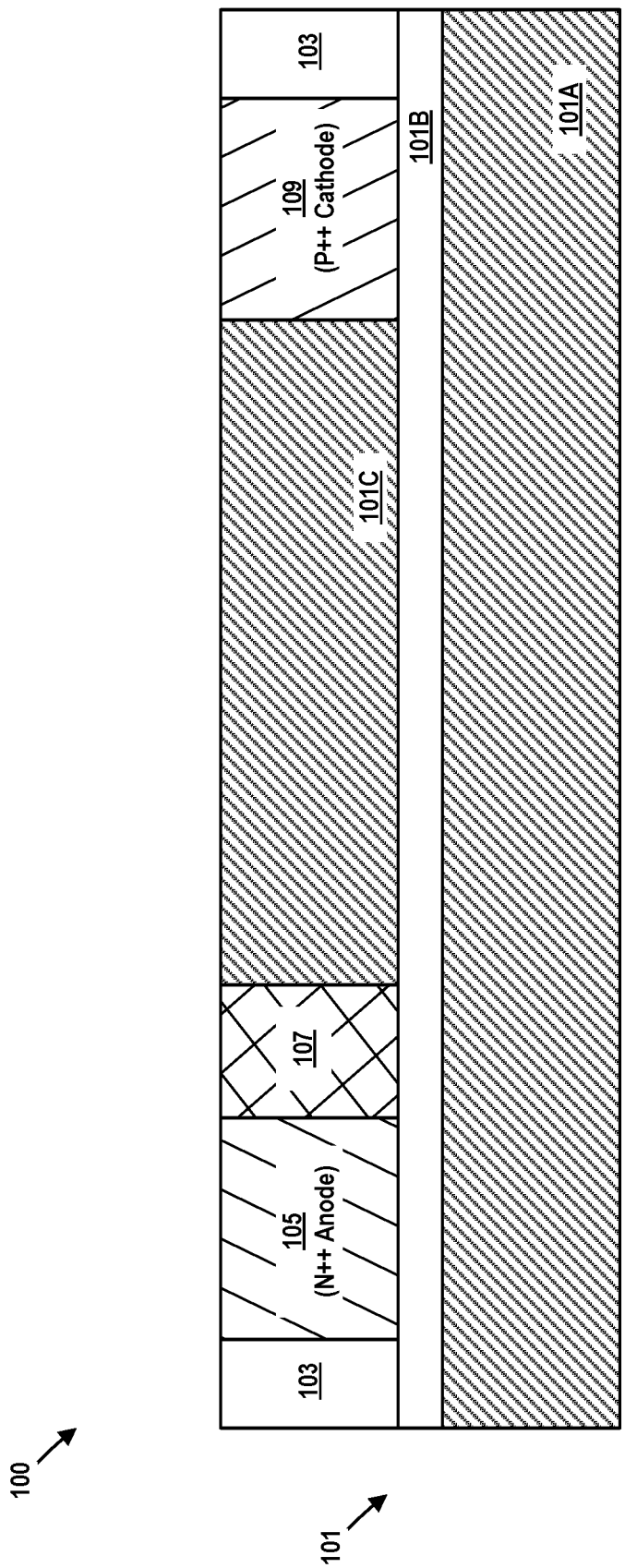
Figure 4:
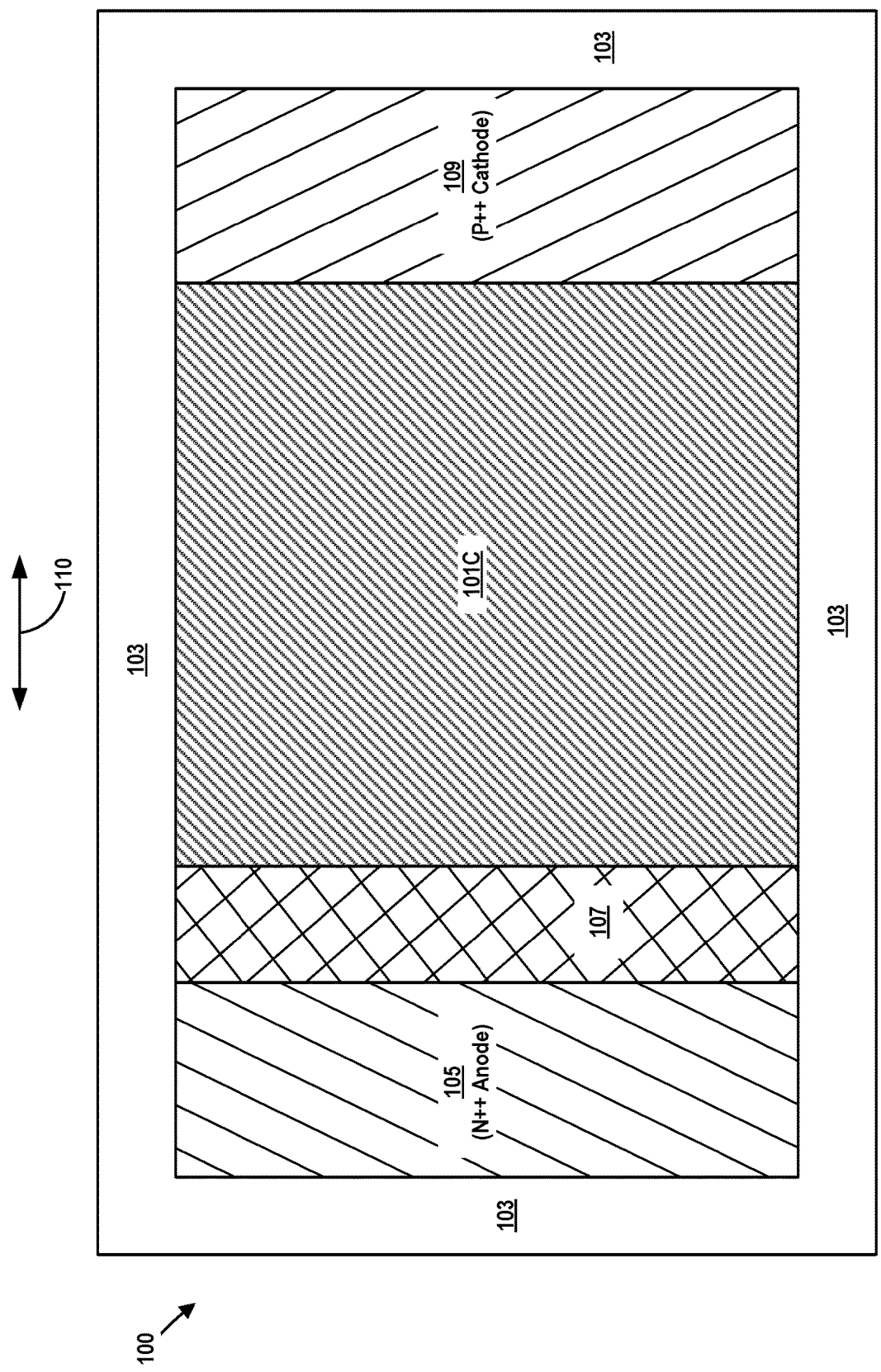

FIG. 3 (cross-sectional view) and FIG. 4 (plan view) depict the photodiode structure 100 after several masking and implantation process operations were performed to for an N++ doped anode region 105, an N+ doped impact ionization region 107 (i.e., a multiplication region) and a P++ doped cathode region 109 in the active semiconductor layer 101C. The formation of the doped regions 105, 107, 109 may be performed in any order and/or performed at any desired point in the process flow. As will be appreciated by those skilled in the art, in one illustrative process flow, each of the doped regions 105, 107, 109 may be formed by forming a patterned implant mask (not shown) and thereafter performing one or more ion implantation processes through the patterned implant mask to form the doped region using traditional ion implantation tools and techniques. As depicted in FIG. 4, in one illustrative embodiment, each of the doped regions 105, 107, 109 has a substantially rectangular configuration when viewed from above. The lateral width (in the direction 110 shown in FIG. 4) may vary depending upon the particular application. In some applications, all of the doped regions 105, 107, 109 may have the same lateral width or they may all have different lateral widths. In the example depicted herein, the lateral width of the N++ doped anode region 105 and the P++ doped cathode region 109 are approximately the same, while the lateral width of the N+ doped impact ionization region 107 is less than that of the other doped regions 105, 109. With reference to FIG. 3, in the depicted example, the vertical depth of the doped regions 105, 107, 109 are all approximately the same and all of the doped regions 105, 107, 109 extend throughout substantially the entire vertical thickness of the active semiconductor layer 101C, but that may not be the case in all applications.

The maximum concentration of dopant atoms in the N++ doped anode region 105 may vary depending upon the particular application, e.g., 1E20–1E23 ions/$cm^3$. The vertical depth of the N++ doped anode region 105 and the location of the peak concentration of dopant atoms in the N++ doped anode region 105 within the vertical thickness of the active semiconductor layer 101C may also vary depending upon the particular application. In one illustrative example, the vertical depth of the N++ doped anode region 105 may be about equal to the vertical thickness of the active semiconductor layer 101C and the peak concentration of dopant atoms may be located at approximately mid-thickness of the active semiconductor layer 101C. The N++ doped anode region 105 may be doped with any species of N-type dopant, e.g., arsenic, phosphorus, etc.

The maximum concentration of dopant atoms in the N+ doped impact ionization region 107 (i.e., a multiplication region) may vary depending upon the particular application, e.g., 1E18–1E20 ions/$cm^3$. The vertical depth of the N+ doped impact ionization region 107 and the location of the peak concentration of dopant atoms in the N+ doped impact ionization region 107 within the vertical thickness of the active semiconductor layer 101C may also vary depending upon the particular application. In one illustrative example, the vertical depth of the N+ doped impact ionization region 107 may be about equal to the vertical thickness of the active semiconductor layer 101C and the peak concentration of dopant atoms may be located at approximately mid-thickness of the active semiconductor layer 101C. The N+ doped impact ionization region 107 may be doped with any species of N-type dopant, e.g., arsenic, phosphorus, etc.

The maximum concentration of dopant atoms in the P++ doped cathode region 109 may vary depending upon the particular application, e.g., 1E20–1E23 ions/cm$^3$. The vertical depth of the P++ doped cathode region 109 and the location of the peak concentration of dopant atoms in the P++ doped cathode region 109 within the vertical thickness of the active semiconductor layer 101C may also vary depending upon the particular application. In one illustrative example, the vertical depth of the P++ doped cathode region 109 may be about equal to the vertical thickness of the active semiconductor layer 101C and the peak concentration of dopant atoms may be located at approximately mid-thickness of the active semiconductor layer 101C. The P++ doped cathode region 109 may be doped with any species of P-type dopant, e.g., boron, boron difluoride, etc.

Figure 5:
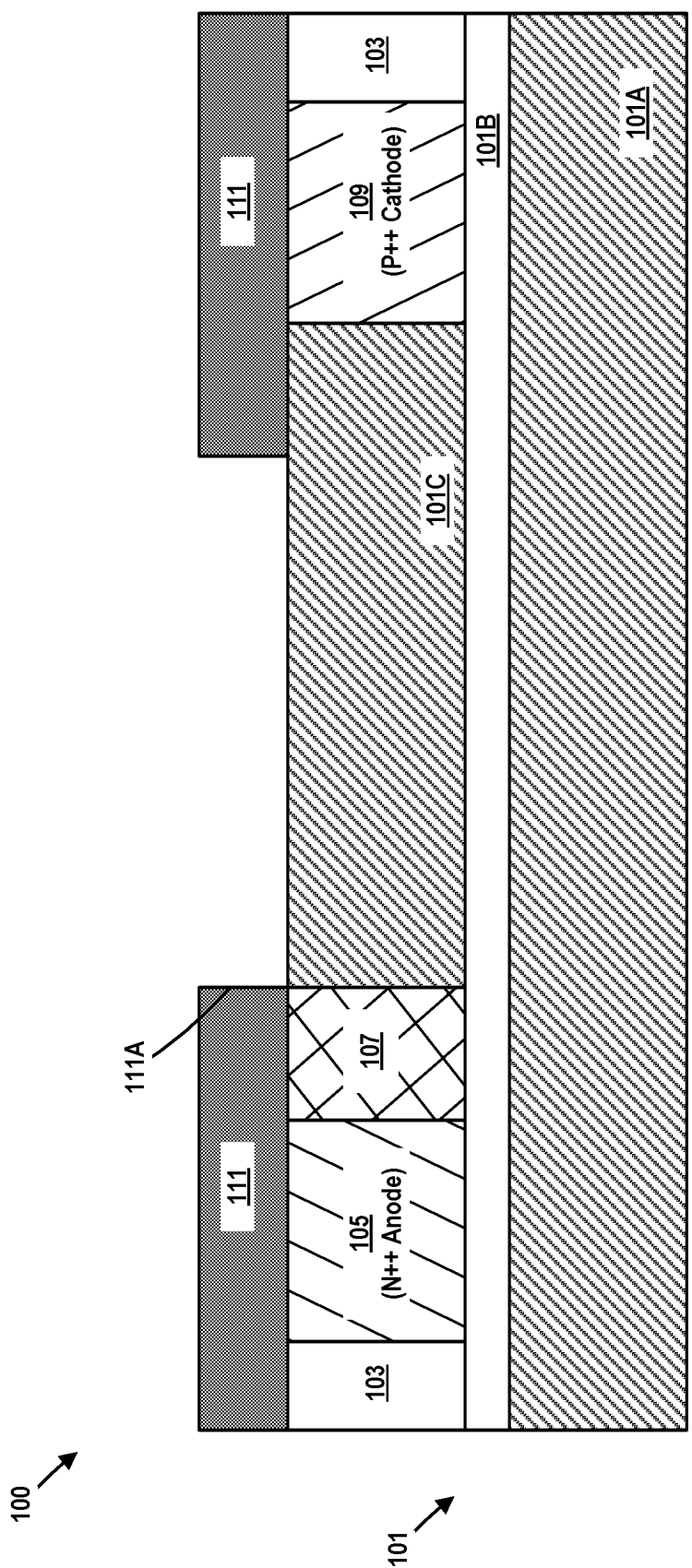

FIG. 5 depicts the photodiode structure 100 after a patterned mask layer 111, with an opening 111A defined therein, was formed above the substrate 101. The patterned mask layer 111 may take a variety of forms and may be comprised of a variety of different materials e.g., silicon nitride, silicon dioxide, etc. The patterned mask layer 111 may be formed by performing known deposition, photolithography and etching techniques.

Figure 6:
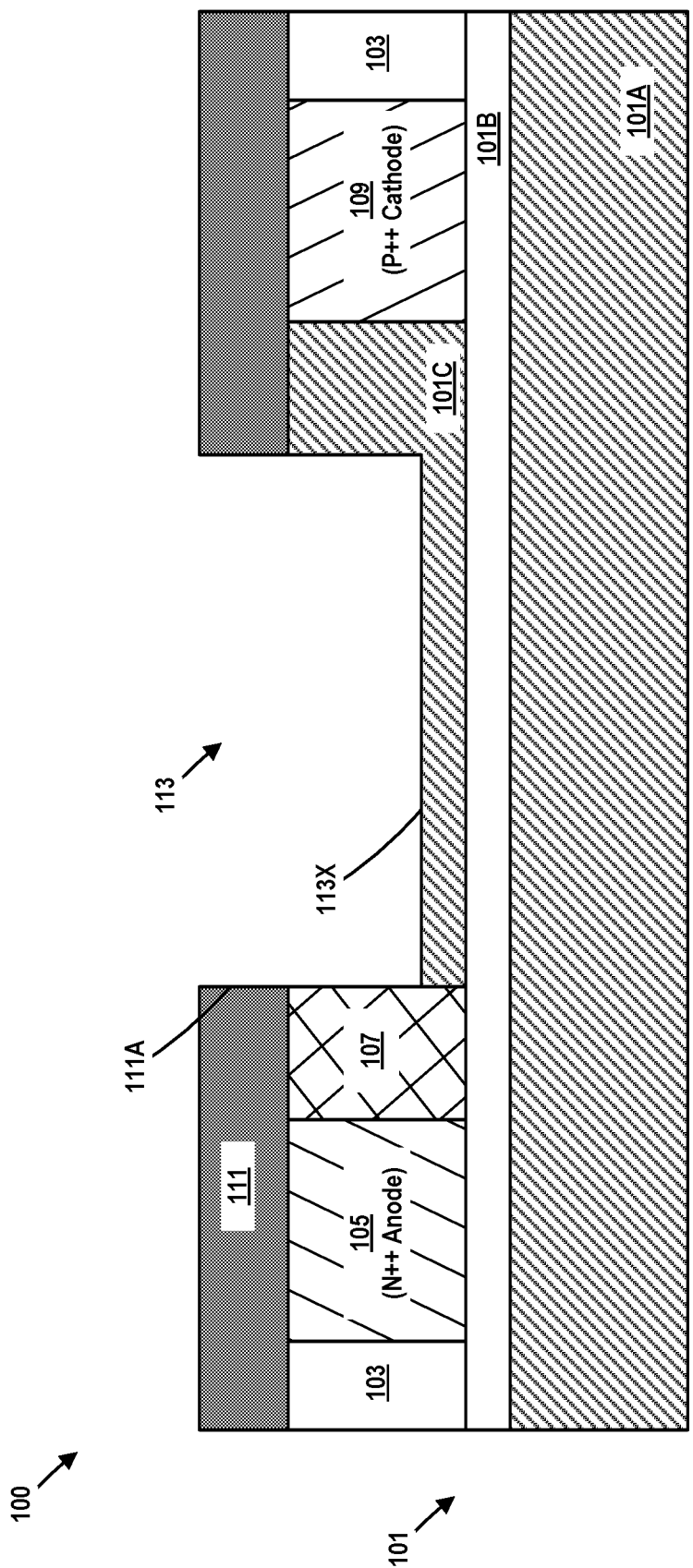
Figure 7:
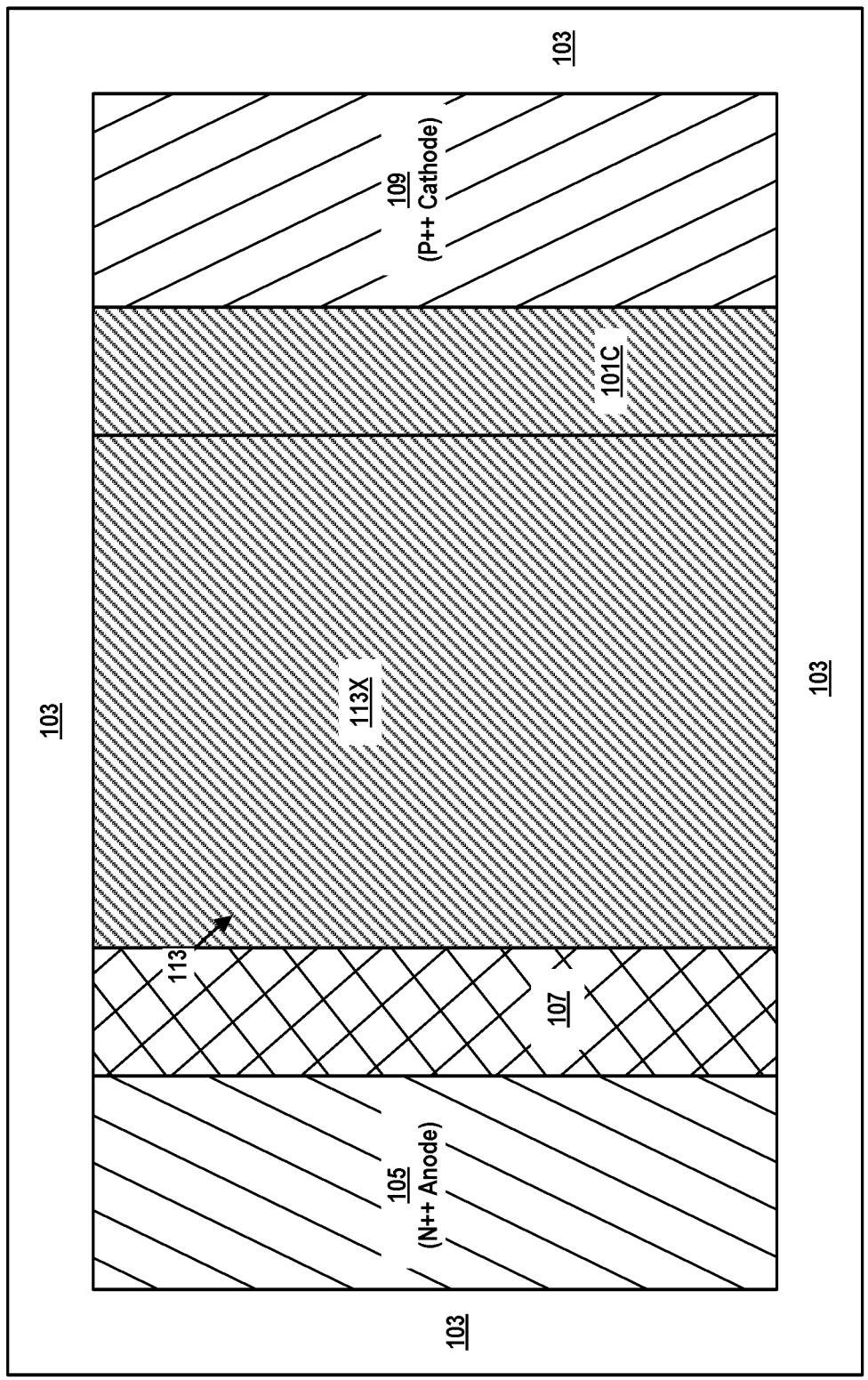

FIG. 6 (cross-sectional view) and FIG. 7 (plan view) depict the photodiode structure 100 after an etching process, e.g., an anisotropic etching process, was performed to form a trench 113, with a bottom surface 113X, in the active semiconductor layer 101C. As will be appreciated by those skilled in the art after a complete reading of the present application, the trench 113 is where the absorber and charge region of the photodiode structure 100 will be formed. The trench 113 is part of the waveguide that helps with evanescent coupling. The depth of the trench 113 may vary depending upon the particular application and the thickness of the active semiconductor layer 101C. In the depicted example, the depth of the trench 113 is less than the thickness of the active semiconductor layer 101C. The thickness of the active semiconductor layer 101C positioned below the bottom 113X of the trench 113 and above the upper surface of the buried insulation layer 101 may vary depending upon the particular application, e.g., about 10 nm.

Figure 8:
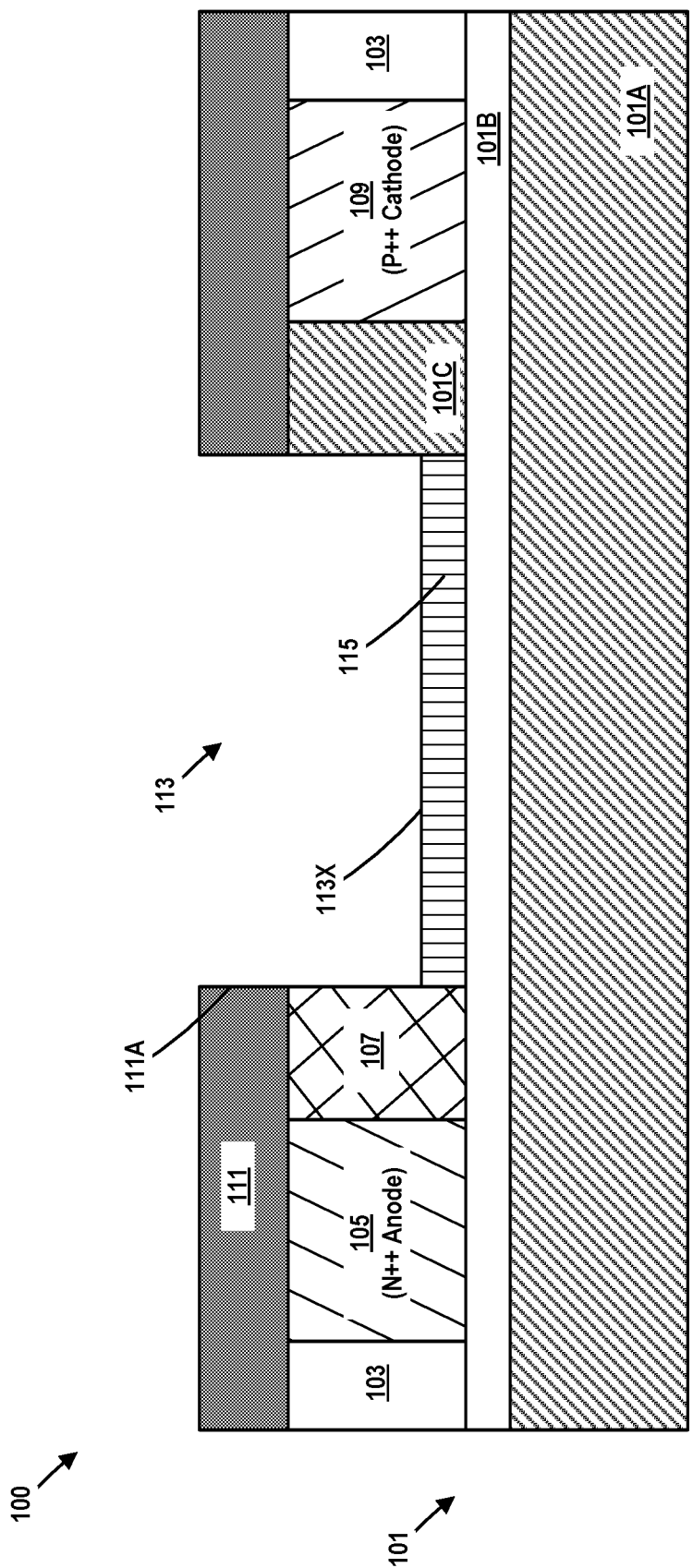

FIG. 8 depicts the photodiode structure 100 after an implantation process operation was performed to form a P+ implant region 115 in the portion of the active semiconductor layer 101C positioned between the bottom 113X of the trench 113 and the upper surface of the buried insulation layer 101B. As will be appreciated by those skilled in the art after a complete reading of the present application, and as described more fully below, a plurality of quantum dots will be grown in the trench 113 whereby the silicon active semiconductor layer 101C will act like a strained layer from the growth of the quantum dots. The purpose of the P+ implant region 115 is to provide isolation from the intrinsically doped quantum dots. The maximum concentration of dopant atoms in the P+ implant region 115 may vary depending upon the particular application, e.g., 1E18–1E20 ions/cm$^3$. The vertical depth of the P+ implant region 115 and the location of the peak concentration of dopant atoms in the P+ implant region 115 may also vary depending upon the particular application. In one illustrative example, the P+ implant region 115 may extend from the bottom 113X of the trench 113 to the upper surface of the buried insulation layer 101B. The P+ implant region 115 may be doped with any species of P-type dopant, e.g., boron, boron difluoride, etc.

Figure 9:
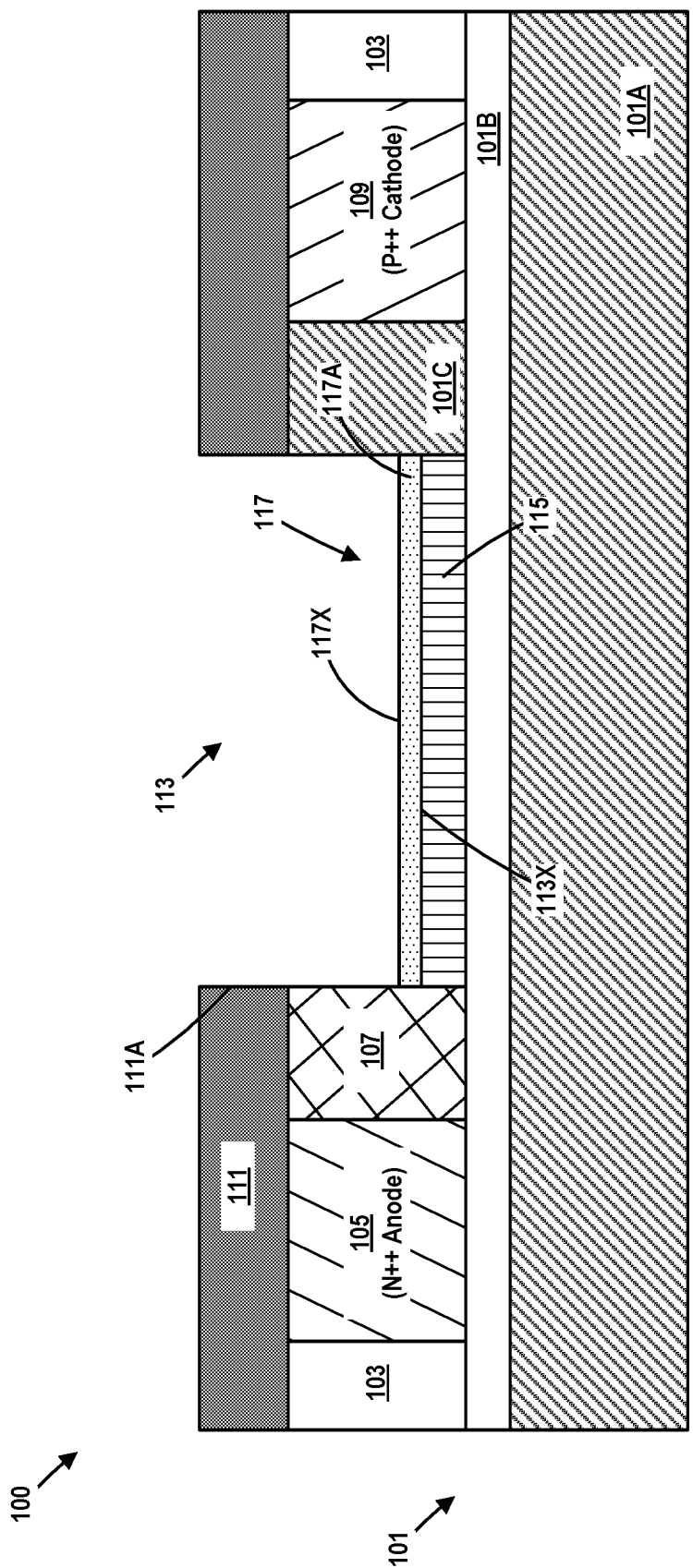

FIG. 9 depicts the photodiode structure 100 after a first portion 117A of a P+ doped charge region 117 was formed on the bottom 113X of the trench 113. In one illustrative embodiment, the first portion 117A of the P+ doped charge region 117 was formed on and in physical contact with the bottom 113X of the trench 113. The first portion 117A of the P+ doped charge region 117 may be formed by performing traditional epitaxial semiconductor growth processes and it may formed to any desired thickness, e.g., 10-20 nm. As formed, the first portion 117A of the P+ doped charge region 117 has an upper surface 117X. The first portion 117A of the P+ doped charge region 117 may be comprised of a variety of different materials, e.g., silicon, silicon germanium, etc. In one illustrative process flow, the first portion 117A of the P+ doped charge region 117 may be doped with a P-type dopant as it is grown, i.e., it may be doped in situ. In other applications, the epi semiconductor material for the first portion 117A of the P+ doped charge region 117 may be initially formed as substantially un-doped epi material and thereafter doped with the appropriate dopant atoms by performing one or more ion implantation processes. The maximum concentration of dopant atoms in the first portion 117A of the P+ doped charge region 117 may vary depending upon the particular application, e.g., 1E18–1E20 ions/cm$^3$. The location of the peak concentration of dopant atoms within the vertical thickness of the first portion 117A of the P+ doped charge region 117 may also vary depending upon the particular application. In one illustrative example, the peak concentration of dopant atoms may be located at approximately mid-thickness of the first portion 117A of the P+ doped charge region 117. The first portion 117A of the P+ doped charge region 117 may be doped with any species of P-type dopant, e.g., boron, boron difluoride, etc.

Figure 10:
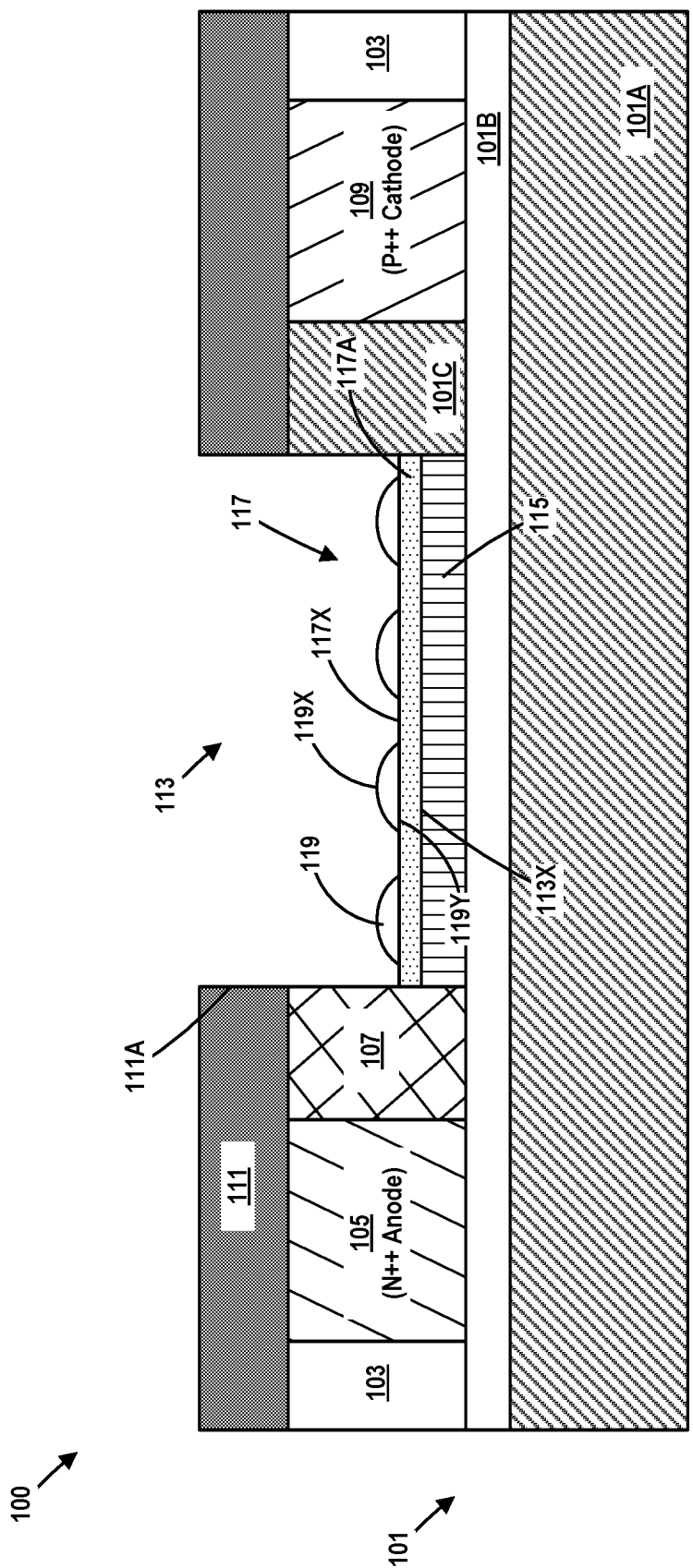

FIG. 10 depicts the photodiode structure 100 after a plurality of quantum dots 119 were formed above the first portion 117A of a P+ doped charge region 117. In one illustrative embodiment, the plurality of quantum dots 119 was formed on and in physical contact with an upper surface 117X of the first portion 117A of the P+ doped charge region 117. In one illustrative embodiment, the plurality of quantum dots 119 may be formed by performing a known Stanski-Krastanov (SK) growth technique. In general, the SK growth process occurs when there is a relatively large mismatch (e.g., 50-100%) between the lattice structures of the two hetero-structure constituent materials. Due to this lattice mismatch, elastic strain energy is accumulated in the epi material which assists in allowing the plurality of quantum dots 119 to grow. In general, the quantum dots 119 may have any desired configuration when viewed from above, e.g., substantially circular, substantially oval, substantially pyramidal, etc. Additionally the vertical thickness of the quantum dots 119, as measured from the upper surface 119X to the bottom surface 119Y may also vary depending upon the particular application, e.g., 1-10 nm. The lateral spacing between adjacent quantum dots 119 may also vary depending upon the particular application, e.g., 10-100 nm. Lastly, in the case where the quantum dots 119 have a substantially circular pattern when viewed from above, in one illustrative example, the quantum dots 119 may have an approximate diameter of about 5-40 nm.

Figure 11:
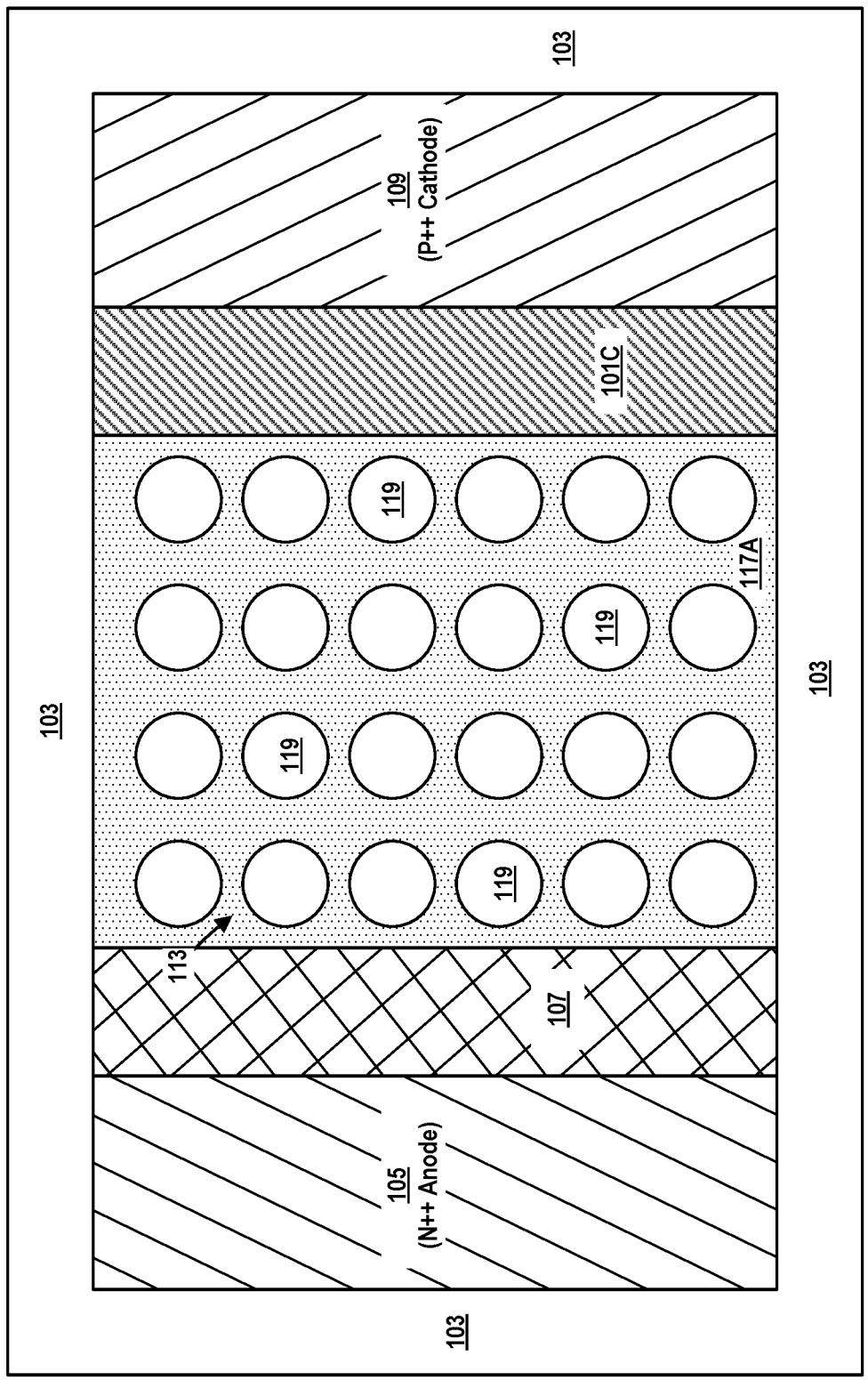
Figure 12:
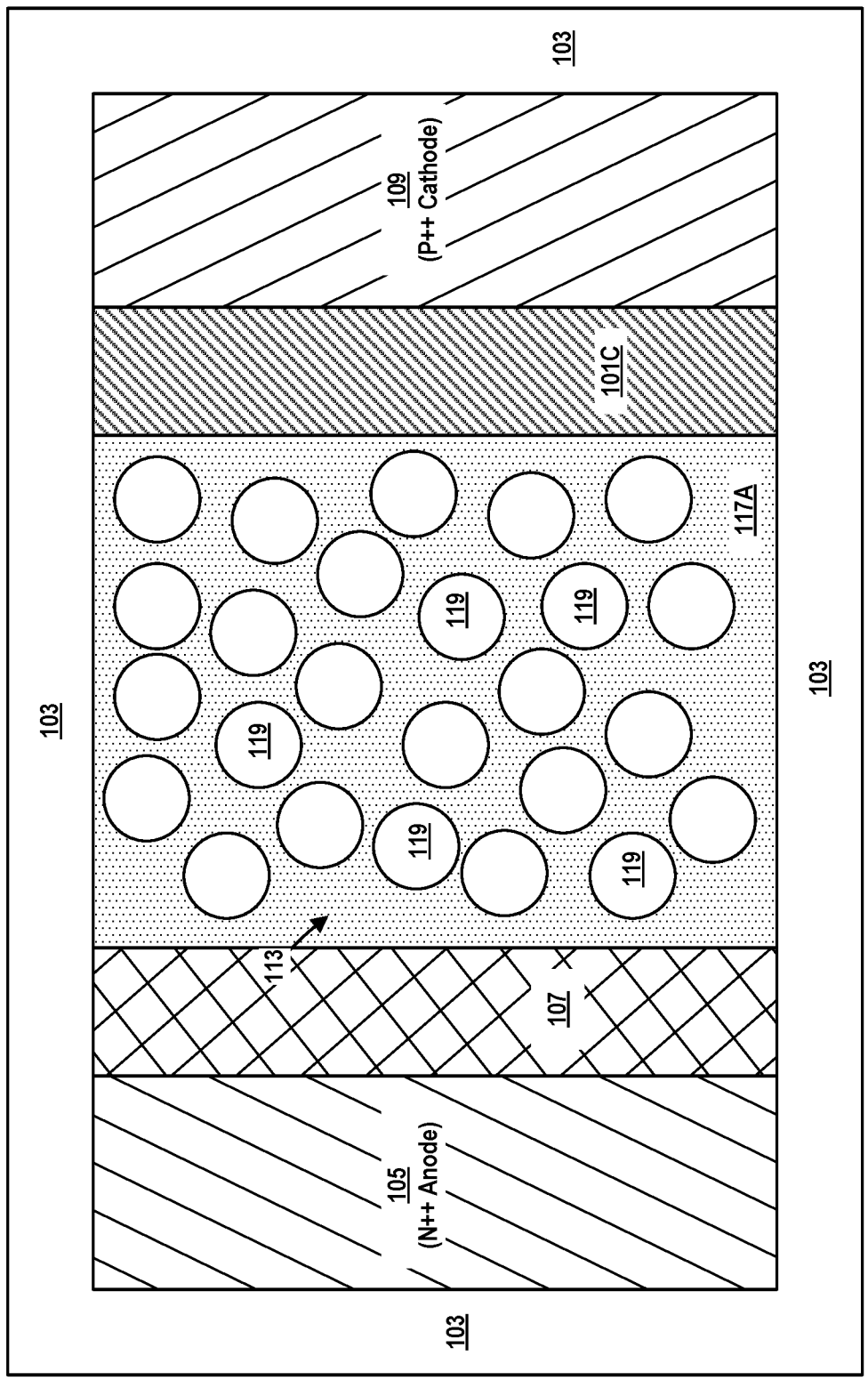

FIG. 11 is a plan view of the photodiode structure 100 showing the quantum dots 119 formed in an ordered array of rows and columns. FIG. 12 is a plan view of the photodiode structure 100 showing the quantum dots 119 formed in a non-ordered or random pattern. In the case where the photodiode structure 100 comprises a plurality of layers of quantum dots 119 (described more fully below) all of the layers of quantum dots 119 may be formed with an ordered array pattern or all of the layers of quantum dots 119 may be formed with a random pattern. In some cases, all of the ordered layers of quantum dots 119 may have the same ordered pattern, but that may not be the case in all applications. In the case where all of the layers of quantum dots 119 are formed in a random pattern, each layer of quantum dots 119 may be formed with the same random pattern, but that may not be the case in all applications. In even further embodiments where the photodiode structure 100 comprises a plurality of layers of quantum dots 119, the photodiode structure 100 may be formed with one or more layers of quantum dots 119 having an ordered pattern and one or more layers of quantum dots 119 having a random pattern. In some applications, a layer of quantum dots 119 having a random pattern may be positioned vertically between upper and lower layers of quantum dots 119 having a random pattern. The opposite configuration is also possible. In other cases, a first group of layers of quantum dots 119 having a random pattern may be positioned vertically adjacent one another while a second group of layers of quantum dots 119 having an ordered pattern may be positioned vertically adjacent one another, where the first group is positioned vertically below the second group. The opposite configuration is also possible.

The quantum dots 119 may be formed by performing an epitaxial growth process and the quantum dots 119 may be doped or un-doped. In the case where the quantum dots 119 are doped, they may be doped with a P-type dopant or an N-type dopant and they may be doped in situ or by performing an ion implantation process. The maximum concentration of dopant atoms in the quantum dots 119 may vary depending upon the particular application, e.g., 1E14–1E16 ions/cm$^3$ (or they may be an intrinsic material perhaps with a dopant concentration less than 1E14). The location of the peak concentration of dopant atoms within the vertical thickness of the quantum dots 119 may also vary depending upon the particular application. In one illustrative example, the peak concentration of dopant atoms may be located at approximately mid-thickness of the quantum dots 119. The quantum dots 119 may be comprised of a variety of different semiconductor materials, e.g., a silicon-containing semiconductor material, a germanium-containing semiconductor material, silicon germanium, substantially pure silicon, substantially pure germanium, etc. In one illustrative example, where the photodiode structure 100 will be exposed to incident light having a wavelength of 1.5 μm or greater, the quantum dots 119 may be comprised of substantially pure germanium. In another illustrative example where the photodiode structure 100 will be exposed to incident light having a wavelength of less than 1.5 μm, the quantum dots 119 may be comprised of substantially pure silicon.

Figure 13:
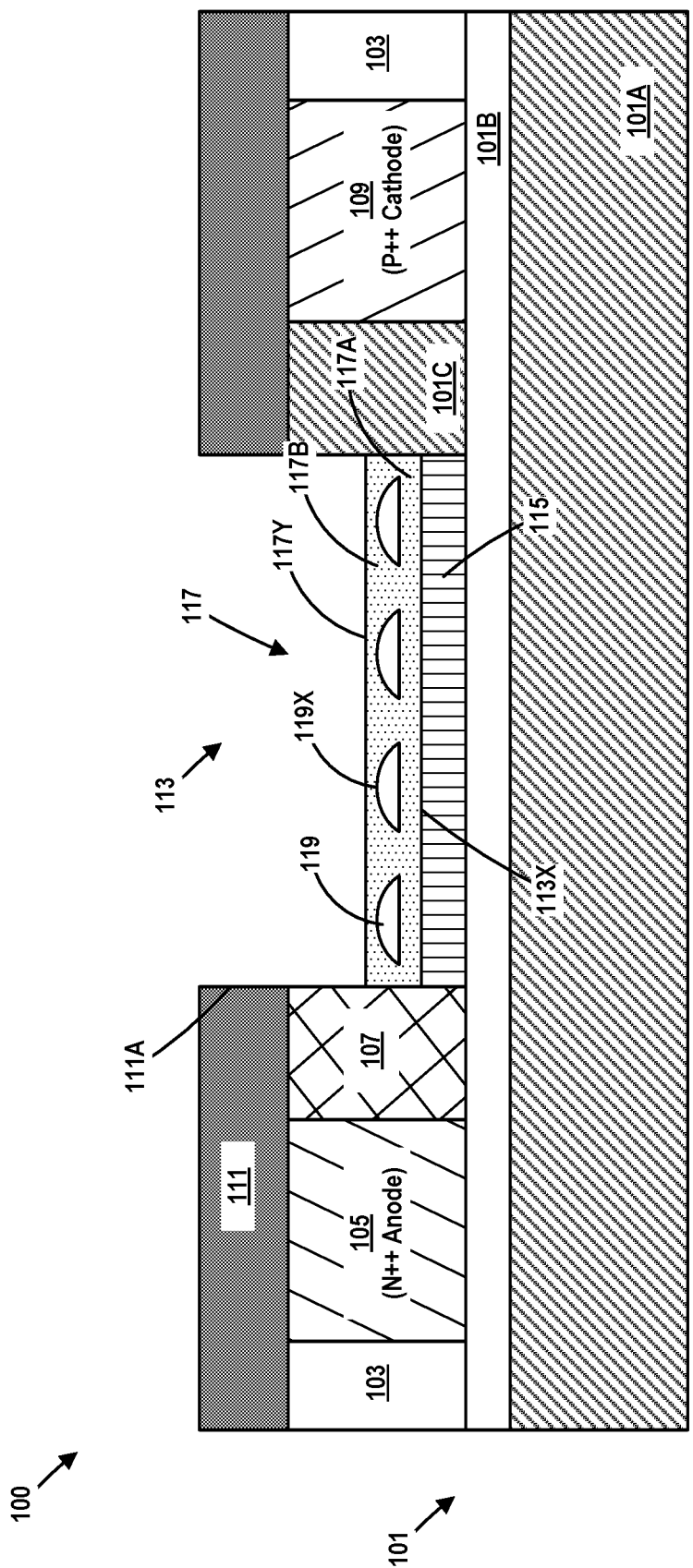

FIG. 13 depicts the photodiode structure 100 after a second portion 117B of the P+ doped charge region 117 was formed above the first portion 117A of the P+ doped charge region 117 and above the quantum dots 119. Note that the upper surface 117Y of the second portion 117B of the P+ doped charge region 117 is positioned above the uppermost surface 119X of the plurality of quantum dots 119. That is, in one illustrative embodiment, the combination of the first portion 117A and the second portion 117B of the P+ doped charge region 117 encapsulates the plurality of quantum dots 119. The distance between the upper surface 117Y of the second portion 117B of the P+ doped charge region 117 and the uppermost surface 119X of the quantum dots 119 may vary depending upon the particular application, e.g., 5-30 nm. In one illustrative embodiment, the first portion 117A and the second portion 117B of the P+ doped charge region 117 may be comprised of the same material and may be doped in a similar manner as described above in connection with the first portion of the P+ doped charge region 117, but that may not be the case in all applications. In one illustrative embodiment, the second portion 117B of the P+ doped charge region 117 was formed on and in physical contact with the upper surface 117X of the first portion 117A of the P+ doped charge region 117. The second portion 117B of the P+ doped charge region 117 may be formed by performing traditional epitaxial semiconductor growth processes and it may formed to any desired thickness, e.g., 10-100 nm. However, in the case where stacked quantum dots 119 are being formed, it may be desirable that the second portion 117B of the P+ doped charge region 117 may have a lesser thickness, e.g., 5-20 nm. Henceforth the combination of the first portion 117A and the second portion 117B of the P+ doped charge region 117 may be collectively referred to as the P+ doped charge region 117.

Figure 14:
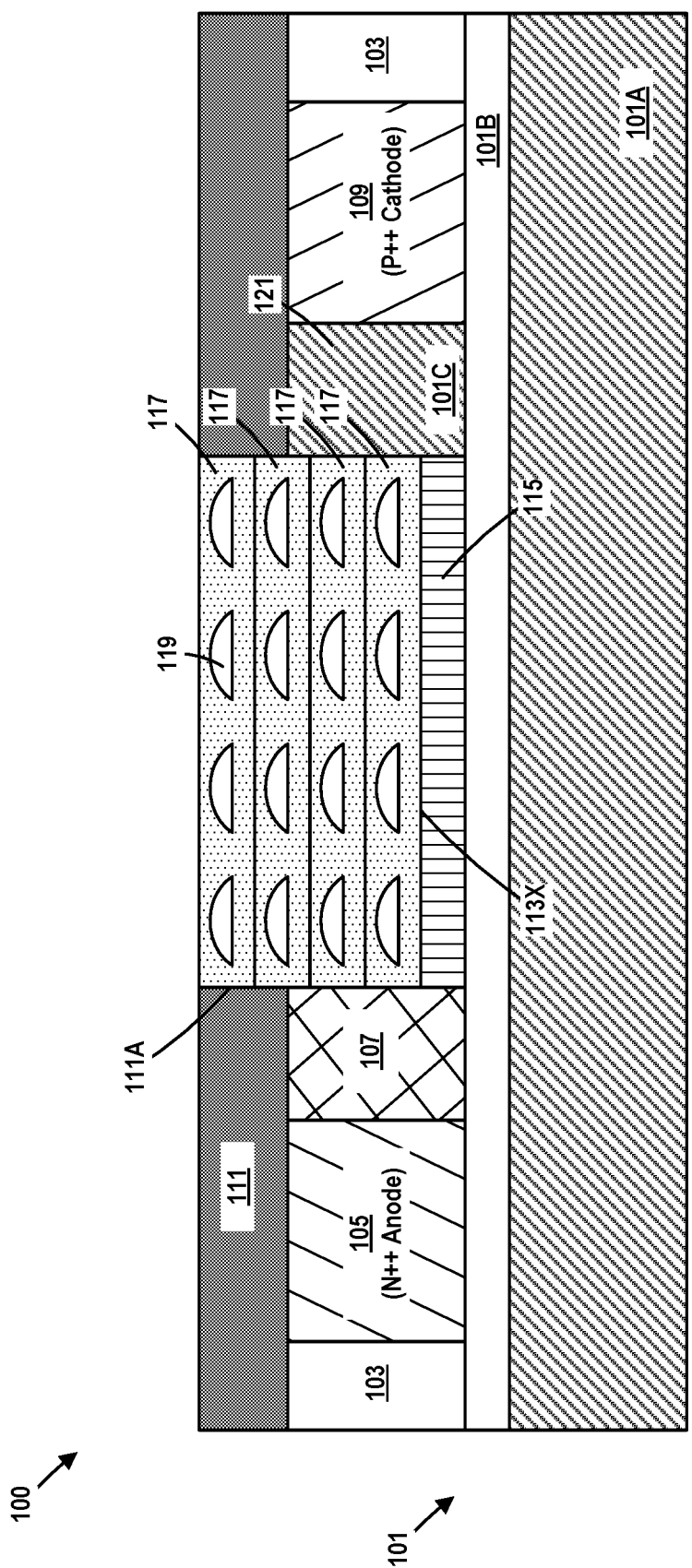

Depending upon the particular application, one or more of such P+ doped charge regions 117 may be formed for the photodiode structure 100. In the specific example depicted herein, four of the P+ doped charge regions 117 are formed for the photodiode structure 100, but any desired number of such P+ doped charge regions 117 may be formed for the P+ doped charge regions 117. FIG. 14 depicts the photodiode structure 100 after the formation of three additional P+ doped charge regions 117 were formed in the combination of trench 113 and in the opening 111A in the patterned masking layer 111 using the techniques described above. In the example shown in FIG. 14, the photodiode structure 100 comprises an N++ doped anode region 105, a P++ doped cathode region 109 and at least one P+ doped charge region 117 (with a plurality of quantum dots 119 encapsulated therein) that is positioned laterally between the N++ doped anode region 105 and the P++ doped cathode region 109. Additionally, in the depicted example, the photodiode structure 100 also comprises an N+ doped impact ionization region 107 positioned laterally between the N++ doped anode region 105 and the at least one P+ doped charge region 117, as well as a region of substantially un-doped intrinsic semiconductor material 121 positioned laterally between the at least one P+ doped charge region 117 and the P++ doped cathode region 109. Additionally, in one illustrative embodiment, the N+ doped impact ionization region 107 abuts and engages the N++ doped anode region 105, the at least one P+ doped charge region 117 abuts and engages the N+ doped impact ionization region 107, the at least one P+ doped charge region 117 abuts and engages the region of substantially un-doped intrinsic semiconductor material 121 and the region of substantially un-doped intrinsic semiconductor material 121 abuts and engages the P++ doped cathode region 109.

Figure 15:
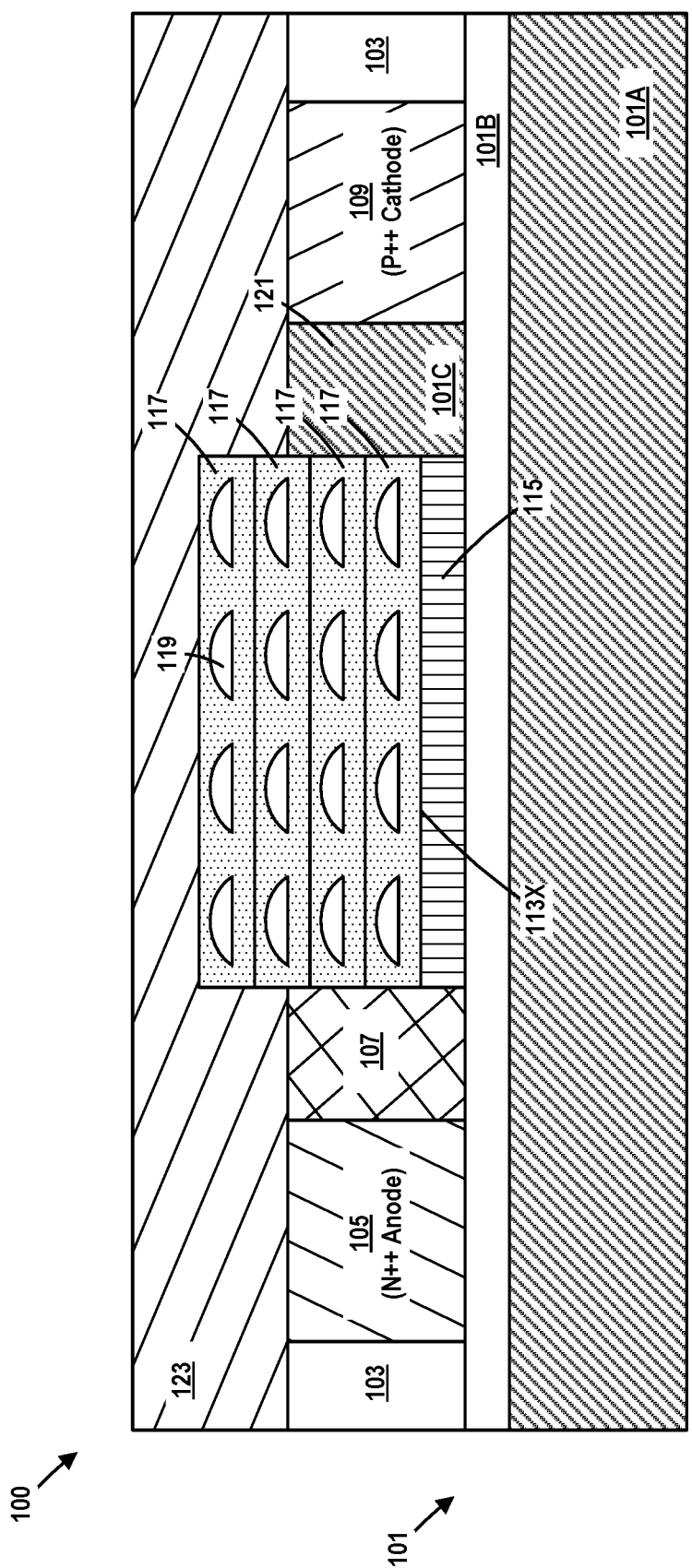

FIG. 15 depicts the photodiode structure 100 after several process operations were performed. First, the patterned mask layer 111 was removed. Then, a passivation material layer 123 was formed above the substrate 101. In one illustrative embodiment, the passivation material layer 123 may be formed by depositing a conformal layer of the passivation material. The passivation material layer 123 may be comprised of a variety of different materials, e.g., silicon nitride, silicon dioxide, silicon oxynitride, etc. Moreover, the passivation material layer 123 may be formed to any desired thickness, e.g., nanometers to several micrometers. The passivation material layer 123 can also be a heterostructure, e.g., comprising SiO$_2$/SiON/carbon doped porous SiO$_2$, etc.

Figure 16:
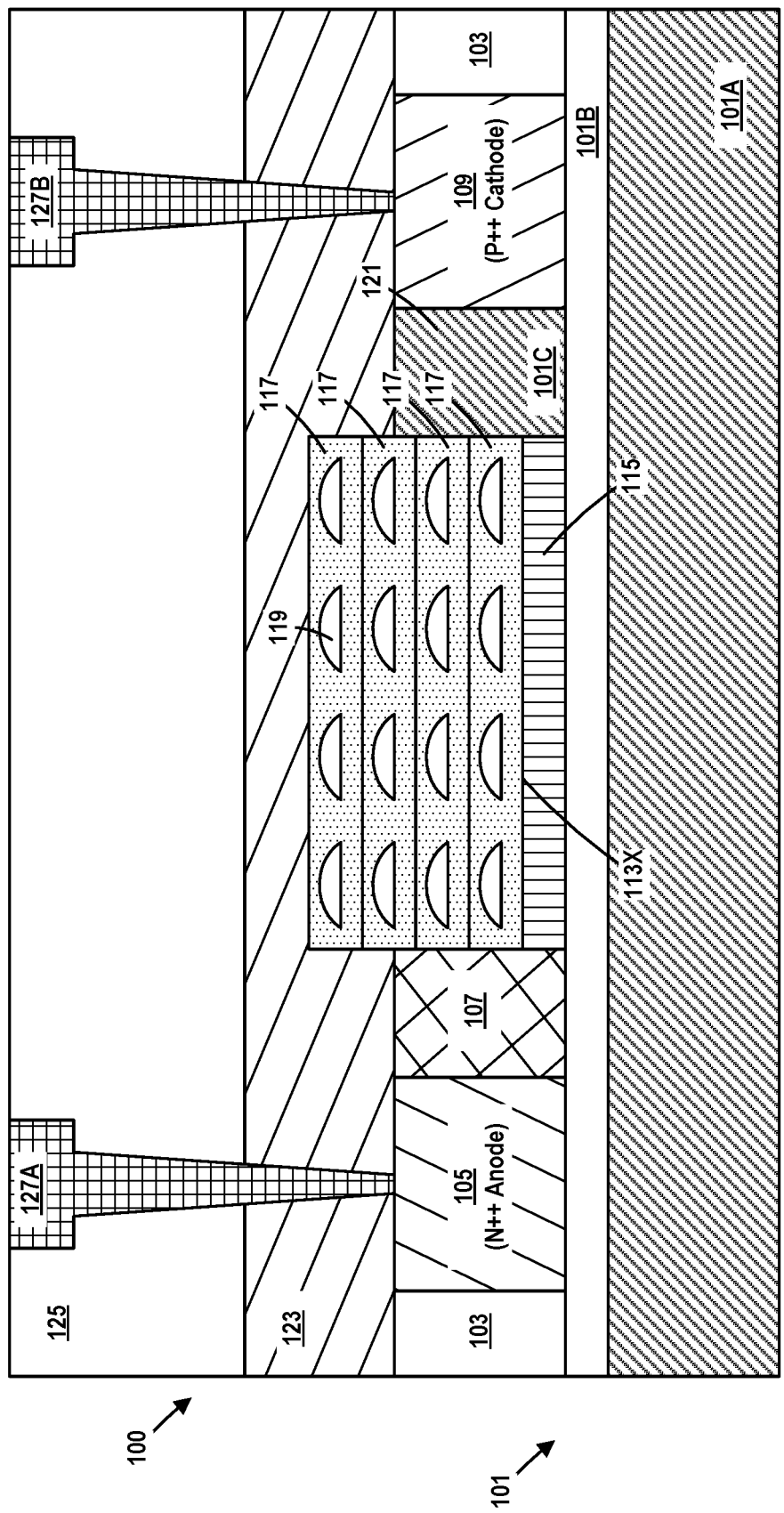

FIG. 16 depicts the photodiode structure 100 after several process operations were performed. A simplistically depicted one or more layers of insulating material 125 was formed above the photodiode structure 100. In a real-world device, the one or more layers of insulating material 125 may comprise multiple layers of material and the layers of material may be made of different materials. For example, the one or more layers of insulating material 125 may comprise one or more layers of silicon dioxide with a layer of silicon nitride (which functions as an etch stop layer) positioned between the layers of silicon dioxide. The structure, composition and techniques used to form such layer(s) of insulating material are well known to those skilled in the art. Thereafter, illustrative conductive contact structures 127A, 127B (collectively referenced using the numeral 127) were formed so as to conductively contact the N++ doped anode region 105 and the P++ doped cathode region 109, respectively. The structure, composition and techniques used to form such conductive contact structures 127 are well known to those skilled in the art.

As will be appreciated by those skilled in the art after a complete reading of the present application, germanium and silicon are both indirect band gap materials, and thus may be considered to be less than ideal materials for optoelectronics applications. However, the conduction and valence bands are much closer in germanium than in silicon. When germanium is grown on silicon, the germanium has a tensile strain which reduces the bandgap of the germanium material further. Thus, tensile strained germanium quantum dots 119, with a very high level of tensile strain, have a reduced band gap which reduces the direct energy band and improves optoelectronic properties (both detection and lasing) of the germanium material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A photodiode, comprising:
   an N-doped anode region, wherein the N-doped anode region is positioned within an active semiconductor layer;
   a P-doped cathode region, wherein the P-doped cathode region is positioned within the active semiconductor layer;
   at least one P-doped charge region positioned laterally between the N-doped anode region and the P-doped cathode region;
   a plurality of quantum dots embedded within the at least one P-doped charge region; and
   an N-doped impact ionization region positioned laterally between the N-doped anode region and the at least one P-doped charge region.

2. The photodiode of claim 1, further comprising a semiconductor-on-insulator (SOI) that comprises a base semiconductor layer, a buried insulation layer positioned on the base semiconductor layer, and the active semiconductor layer, wherein the active semiconductor layer is positioned on the buried insulation layer, and wherein the N-doped anode region and the P-doped cathode region are positioned within the active semiconductor layer of the SOI.

3. The photodiode of claim 1, wherein the N-doped anode region has a dopant concentration of an N-type dopant that falls within a range of $1E20$-$1E23$ ions/cm$^3$, the N-doped impact ionization region has a dopant concentration of an N-type dopant that falls within a range of $1E18$-$1E20$ ions/cm$^3$, the at least one P-doped charge region has a dopant concentration of a P-type dopant that falls within a range of $1E18$-$1E20$ ions/cm$^3$ and the P-doped cathode region has a dopant concentration of P-type dopant that falls within a range of $1E20$-$1E23$ ions/cm$^3$.

4. The photodiode of claim 1, wherein at least one P-doped charge region comprises a plurality of P-doped charge regions, wherein each of the plurality of P-doped charge regions comprises a plurality of quantum dots embedded therein.

5. The photodiode of claim 1, wherein, when viewed from above, the plurality of quantum dots embedded within the at least one P-doped charge region have one of an ordered pattern or a random pattern and one of a substantially circular, a substantially oval, or a substantially pyramidal configuration.

6. The photodiode of claim 1, wherein the plurality of quantum dots embedded within the at least one P-doped charge region are doped with a P-type dopant.

7. The photodiode of claim 1, wherein the plurality of quantum dots embedded within the at least one P-doped charge region comprise one of a silicon-containing semiconductor material, a germanium-containing semiconductor material, silicon germanium, substantially pure silicon or substantially pure germanium.

8. The photodiode of claim 1, further comprising a region of a substantially un-doped intrinsic semiconductor material positioned laterally between the at least one P-doped charge region and the P-doped cathode region.

9. The photodiode of claim 8, further comprising a P-doped implant region positioned laterally between the N-doped impact ionization region and the region of a substantially un-doped intrinsic semiconductor material and vertically below the at least one P-doped charge region.

10. The photodiode of claim 1, further comprising a P-doped implant region positioned vertically below the at least one P-doped charge region.

11. The photodiode of claim 1, wherein the N-doped impact ionization region abuts and engages the N-doped anode region and the at least one P-doped charge region abuts and engages the N-doped impact ionization region.

12. The photodiode of claim 11, further comprising a region of a substantially un-doped intrinsic semiconductor material positioned laterally between the at least one P-doped charge region and the P-doped cathode region, wherein the P-doped charge region abuts and engages the region of a substantially un-doped intrinsic semiconductor material and wherein the region of a substantially un-doped intrinsic semiconductor material abuts and engages the P-doped cathode region.

13. The photodiode of claim 1, wherein the plurality of quantum dots have a tensile strain.

14. A photodiode, comprising:
   a semiconductor-on-insulator (SOI) that comprises a base semiconductor layer, a buried insulation layer positioned on the base semiconductor layer and an active semiconductor layer positioned on the buried insulation layer;

an N-doped anode region positioned within the active semiconductor layer;

a P-doped cathode region positioned within the active semiconductor layer;

at least one P-doped charge region positioned within the active semiconductor layer and laterally between the N-doped anode region and the P-doped cathode region;

a plurality of quantum dots embedded within the at least one P-doped charge region; and an N-doped impact ionization region positioned in the active semiconductor layer laterally between the N-doped anode region and the at least one P-doped charge region.

15. The photodiode of claim 14, wherein the at least one P-doped charge region comprises a plurality of P-doped charge regions, wherein at least some of the plurality of P-doped charge regions are positioned in the active semiconductor layer and wherein each of the plurality of P-doped charge regions has a plurality of quantum dots embedded therein.

16. The photodiode of claim 14, wherein, when viewed from above, the plurality of quantum dots embedded within the at least one P-doped charge region have one of an ordered pattern or a random pattern and one of a substantially circular or a substantially oval configuration, wherein the plurality of quantum dots embedded within the at least one P-doped charge region are doped with a P-type dopant and wherein the plurality of quantum dots comprise one of a silicon-containing semiconductor material, a germanium-containing semiconductor material, silicon germanium, substantially pure silicon or substantially pure germanium.

17. The photodiode of claim 14, further comprising a region of a substantially un-doped intrinsic semiconductor material layer positioned in the active semiconductor layer and laterally between the at least one P-doped charge region and the P-doped cathode region.

18. The photodiode of claim 17, further comprising a P-doped implant region positioned in the active semiconductor layer laterally between the N-doped impact ionization region and the region of a substantially un-doped intrinsic semiconductor material and vertically below the at least one P-doped charge region.

19. The photodiode of claim 17, wherein the N-doped impact ionization region abuts and engages the N-doped anode region, the at least one P-doped charge region abuts and engages the N-doped impact ionization region, the at least one P-doped charge region abuts and engages the region of a substantially un-doped intrinsic semiconductor material and the region of a substantially un-doped intrinsic semiconductor material abuts and engages the P-doped cathode region.

20. A photodiode, comprising:
a semiconductor-on-insulator (SOI) that comprises a base semiconductor layer, a buried insulation layer positioned on the base semiconductor layer and an active semiconductor layer positioned on the buried insulation layer, wherein the active semiconductor layer comprises silicon or silicon germanium;

an N-doped anode region positioned within the active semiconductor layer;

a P-doped cathode region positioned within the active semiconductor layer;

at least one P-doped charge region positioned within the active semiconductor layer and laterally between the N-doped anode region and the P-doped cathode region;

a plurality of germanium quantum dots embedded within the at least one P-doped charge region, wherein each of the germanium quantum dots has a tensile strain;

an N-doped impact ionization region positioned in the active semiconductor layer laterally between the N-doped anode region and the at least one P-doped charge region; and a region of a substantially un-doped intrinsic semiconductor material layer positioned in the active semiconductor layer and laterally between the at least one P-doped charge region and the P-doped cathode region.

* * * * *